US006917089B2

(12) United States Patent
Schuurmans et al.

(10) Patent No.: US 6,917,089 B2
(45) Date of Patent: Jul. 12, 2005

(54) INTEGRATED SENSOR PACKAGES AND METHODS OF MAKING THE SAME

(75) Inventors: Johan Schuurmans, Balen (BE); William R. Betts, Burntwood (GB); Roger Diels, Erps-Kwerps (BE); Adrian Hill, Channel Islands (GB)

(73) Assignee: Melexis NV, Ypres (BE)

( * ) Notice: Subject to any disclaimer, the term of this patent is extended or adjusted under 35 U.S.C. 154(b) by 0 days.

(21) Appl. No.: 10/831,489

(22) Filed: Apr. 22, 2004

(65) Prior Publication Data

US 2004/0197957 A1 Oct. 7, 2004

Related U.S. Application Data

(62) Division of application No. 09/956,469, filed on Sep. 18, 2001, now Pat. No. 6,762,077.
(60) Provisional application No. 60/290,326, filed on May 11, 2001.

(51) Int. Cl.$^7$ .......................... H01L 29/82; H01L 43/00
(52) U.S. Cl. ...................................................... 257/427
(58) Field of Search ............................... 257/427, 100, 257/113, 114, 116, 421, 424, 428, 431, 432, 433, 528

(56) References Cited

U.S. PATENT DOCUMENTS

| | | | |
|---|---|---|---|
| 4,823,605 A | 4/1989 | Stein | |
| 5,622,873 A | 4/1997 | Kim et al. | |
| 6,254,815 B1 | 7/2001 | Cheperak | |
| 6,420,201 B1 * | 7/2002 | Webster | 438/51 |
| 6,432,737 B1 | 8/2002 | Webster | |
| 6,441,503 B1 | 8/2002 | Webster | |
| 6,762,077 B2 * | 7/2004 | Schuurmans et al. | 438/112 |
| 2002/0168795 A1 | 11/2002 | Schuurmans | |

FOREIGN PATENT DOCUMENTS

| | | |
|---|---|---|
| EP | 0 813 236 A1 | 12/1997 |
| JP | 04 352435 A | 12/1992 |
| JP | 06 196750 A | 7/1994 |
| JP | 08 005473 A | 1/1996 |
| JP | 09 119875 A | 5/1997 |
| JP | 09 298249 A | 11/1997 |
| JP | 09 304211 A | 11/1997 |
| JP | 11 307808 A | 11/1999 |

* cited by examiner

*Primary Examiner*—David Nhu
(74) *Attorney, Agent, or Firm*—Townsend and Townsend and Crew LLP; Gerald T. Gray

(57) ABSTRACT

Elements of a sensor system are encapsulated into a single package. The sensor elements are covered with a flexible gel coat and then inserted into a molding tool cavity. Each element may be individually coated with a gel blob, or all elements may by coated with a single gel blob. One or more retractable pins are incorporated into the molding tool and in their normal position are each in contact with the gel. A molding compound is injected into the cavity so as to encapsulate the device and gel coat. When the pins are extracted and the device ejected from the molding cavity, one or more passageways in the molding are left defined by the pins. The passageways expose the flexible gel covering the device elements to the atmosphere. For pressure sensitive elements, the gel, being flexible, transfers the local air pressure to the pressure sensitive element. For optical elements, the exposed gel is preferably removed to allow for the passage of radiation to and from the device elements. Alternatively, or in addition, an optically transmitting gel is used so as to allow for the passage of radiation at specific wavelengths.

10 Claims, 2 Drawing Sheets

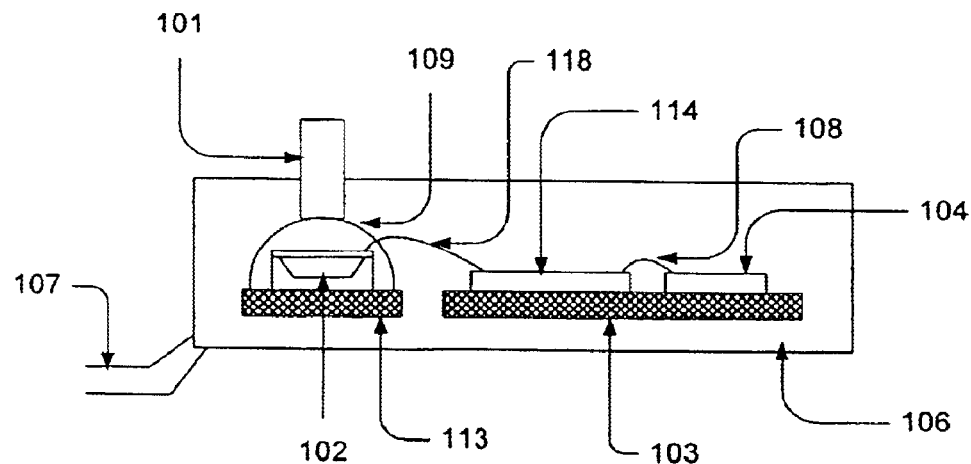
Figure 1. General Schematic
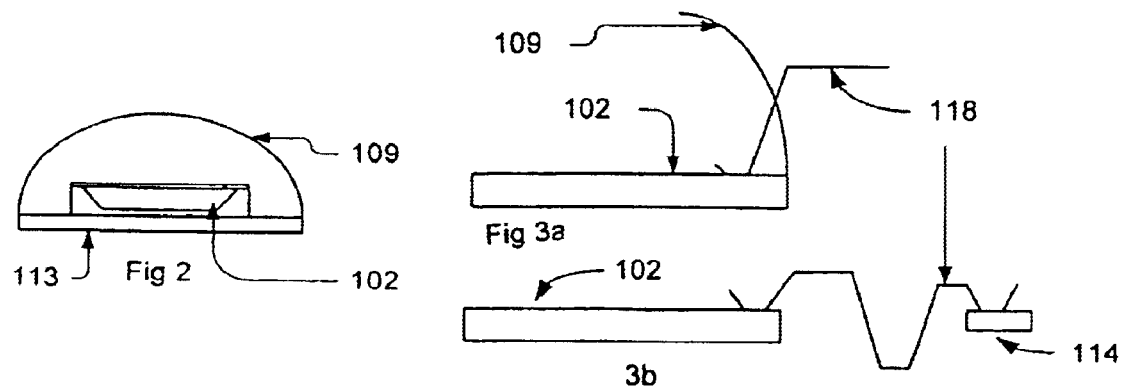

INTEGRATED SENSOR PACKAGES AND METHODS OF MAKING THE SAME

CROSS-REFERENCES TO RELATED APPLICATIONS

This application claims the benefit of U.S. Provisional Application Ser. No. 60/290,326, filed May 11, 2001, entitled "Tire Pressure Sensors and Methods of Making the Same," which is hereby incorporated by reference in its entirety for all purposes. This application is also a division of U.S. patent application Ser. No. 09/956,469, entitled "Tire Pressure Sensors and Methods of Making the Same," filed concurrently with this application on Sep. 18, 2001 now U.S. Pat No. 6,762,077.

BACKGROUND OF THE INVENTION

The present invention relates in general to integrated monitoring systems, and more particularly to systems and methods for encapsulating a sensing element. The present invention is particularly useful for producing low cost optical sensor packages as well as multi sensor systems for the automotive industry.

Radiation sensing systems including integrated radiation sensors and often radiation transmission elements have become more widespread in their use in detecting position, rotation and fluid levels by optical means. While having the inherent drawback of requiring avoidance of any susceptibility to dirt, optical sensors impose no load on the sensed device or material. Optical sensors, including those using IR instead of visible light, often include a transmitter as well as a receiver to ensure the light levels are sufficient for accurate detection of reflected light from the target. Integrating the transmitter and the receiver into a single package has considerable cost benefits. In addition optical set up operations or tolerances can be reduced or eliminated since the combined package is manufactured and tested in a pre-aligned form.

Combining an IR radiation sensor in the same package as a pressure sensor in, for example, an automotive tire pressure sensor module can supply additional information concerning the temperature of the tire to the vehicle ECU's for driver information or safety systems.

It is desirable to provide low cost integrated sensors, such as radiation sensors and pressure sensors, and efficient methods of producing the same.

SUMMARY OF THE INVENTION

The present invention provides integrated sensor packages for use in detecting radiation, e.g., visible and IR radiation, pressure and/or any other detectable physical property, and methods for producing the same. The techniques of the present invention include assembly methodologies that provide low cost sensor devices while maintaining the inherent high reliability as typically found in modern semiconductor packaging techniques.

According to the present invention, the elements of a sensor system are encapsulated into a single package. For example, elements of a wheel mounted tire pressure monitoring and transmitting system are encapsulated into a single package. As another example, elements of an optical transmission and detection system are encapsulated into a single package. The device elements are covered with a flexible gel coat and then inserted into a molding tool cavity. Each element may be individually coated with a separate gel blob, or all elements may be coated with a single gel blob. One or more retractable pins are incorporated into the molding tool and in their normal position are each in contact with the gel. A molding compound is injected into the cavity so as to encapsulate the device and gel coat. When the pins are extracted and the device ejected from the molding cavity, one or more passageways in the molding are left defined by the pins. The passageways expose the flexible gel covering the device elements to the atmosphere. For pressure sensitive elements, the gel, being flexible, transfers the local air pressure to the pressure sensitive element. For optical elements, the exposed gel is preferably removed to allow for the passage of radiation to and from the device elements, i.e., so as to define apertures. Alternatively, or additionally, an optically transmitting gel is used so as to allow for the passage of radiation at specific wavelengths.

According to an aspect of the present invention, a method is provided for encapsulating an integrated circuit device within a plastic molded package. The method typically includes providing an integrated circuit, the integrated circuit including a sensing element, applying a quantity of gel to the integrated circuit such as to cover at least the sensing element, thereby forming a gel-covered assembly, and inserting the gel-covered assembly into a cavity of a molding tool. The method also typically includes attaching a retractable pin to the gel-covered assembly, introducing a plastic mold compound into the cavity so as to encapsulate the gel-covered assembly and at least a portion of the pin, and removing the pin from the gel such as to leave a passageway in the plastic mold encapsulating the gel-covered assembly, thereby exposing the gel to the atmosphere through the passageway.

According to another aspect of the present invention, an encapsulated integrated circuit device is provided. The encapsulated device is typically formed, in part, by providing an integrated circuit, the integrated circuit including a sensing element, applying a quantity of gel to the integrated circuit such as to cover at least the sensing element, thereby forming a gel-covered assembly, and inserting the gel-covered assembly into a cavity of a molding tool. The encapsulated device is further typically formed by attaching a retractable pin to the gel-covered assembly, introducing a plastic mold compound into the cavity so as to encapsulate the gel-covered assembly and at least a portion of the pin, and removing the pin from the gel such as to leave a passageway in the plastic mold encapsulating the gel-covered assembly, thereby exposing the gel to the atmosphere through the passageway.

According to yet another aspect of the present invention, a method is provided for encapsulating an integrated circuit device within a plastic molded package. The method typically includes providing an integrated circuit, the integrated circuit including a radiation sensing element and a radiation transmission element, applying a gel to the integrated circuit such as to cover at least the radiation sensing element and the radiation transmission element, thereby forming a gel-covered assembly, and inserting the gel-covered assembly into a cavity of a molding tool. The method also typically includes attaching at least two retractable pins to the gel-covered assembly, a first pin contacting the gel proximal the optical sensing element and a second pin contacting the gel proximal the optical transmission element, introducing a plastic mold compound into the cavity so as to encapsulate the gel-covered assembly and at least a portion of each pin, and removing the first and second pins from the gel such as to leave passageways in the plastic mold encapsulating the gel-covered assembly, thereby exposing the gel to the atmosphere through the passageways.

According to a further aspect of the present invention, an encapsulated integrated circuit device is provided. The encapsulated device is typically formed, in part, by providing an integrated circuit, the integrated circuit including a radiation sensing element and a radiation transmission element, applying a gel to the integrated circuit such as to cover at least the radiation sensing element and the radiation transmission element, thereby forming a gel-covered assembly, and inserting the gel-covered assembly into a cavity of a molding tool. The encapsulated device is further typically formed by attaching at least two retractable pins to the gel-covered assembly, a first pin contacting the gel proximal the optical sensing element and a second pin contacting the gel proximal the optical transmission element, introducing a plastic mold compound into the cavity so as to encapsulate the gel-covered assembly and at least a portion of each pin, and removing the first and second pins from the gel such as to leave passageways in the plastic mold encapsulating the gel-covered assembly, thereby exposing the gel to the atmosphere through the passageways.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 1 is a schematic diagram showing a general arrangement illustrating a process of encapsulating a pressure sensing circuit assembly according to an embodiment of the present invention;

FIG. 2 illustrates a gel-covered pressure sensing circuit assembly according to an embodiment of the present invention;

FIGS. 3a and 3b illustrate alternate embodiments of electrical connector arrangements according to an embodiment of the present invention.

DESCRIPTION OF THE SPECIFIC EMBODIMENTS

Figure 4:
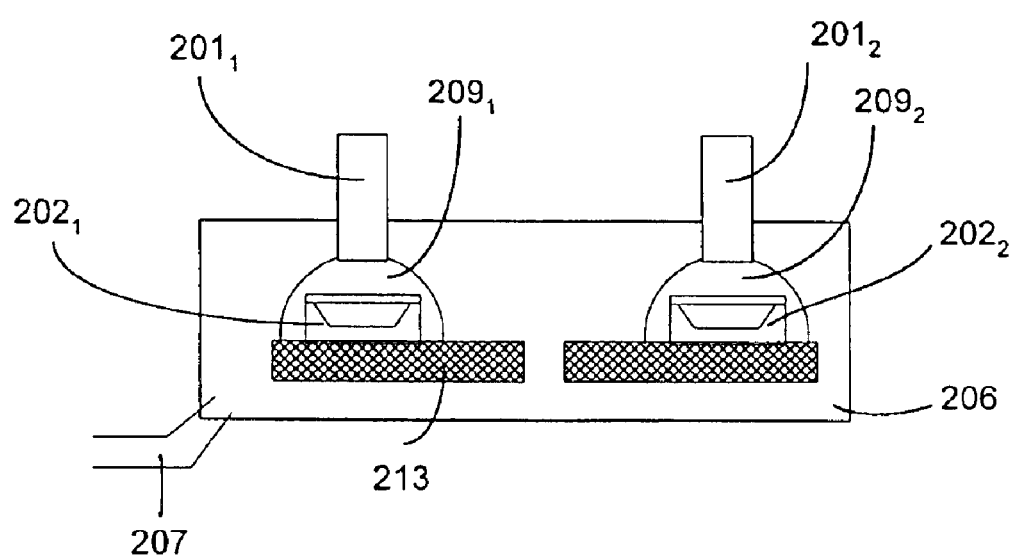
FIG. 4 illustrates a process of encapsulating a sensor device having two elements using two gel blobs and two retractable pins according to an embodiment of the present invention.

In a conventional method of packaging semiconductor devices, an integrated circuit is typically first mounted on a metal carrier or 'paddle'. The electrical connections to the integrated circuit are then made by wire bonding between the connection points on the integrated circuit and the internal ends of the metal pins that will form the connections to the final package.

The integrated circuit assembly is then potted or encapsulated in plastic using injection-molding techniques. Such a package can contain one or more integrated circuits mounted on the 'paddle' which itself may include one or more electrically separate sections for circuitry reasons. In the present invention, such standard packaging techniques are modified to permit the encapsulation, within a standard package, of integrated circuit elements that are designed to be sensitive to pressure and/or radiation (e.g., visible and IR radiation), or any other physical properties, and are particularly suitable for pressure and/or radiation sensors.

To achieve this, a packaging process in accordance with the invention is provided as shown in FIG. 1. An integrated circuit element 102 is mounted on a 'paddle' 113 and electrical connections 118 with other circuitry 114 on 'paddle' 103 are made in the conventional manner. Integrated circuit element 102 may include a pressure sensitive element, a radiation transmitting element, a radiation sensitive element or any element that is sensitive to one or more physical properties. Although any number of other elements may be implemented, examples of such sensing elements include MLX90210 and MLX90240 pressure sensor IC's available from Melexis, and MLX90313, MLX90247 and MLX 0206 IR sensor IC's also available from Melexis at their website (www.melexis.com) or in the US at 41 Locke Road, Concord, N.H. 03301. It should also be appreciated that the paddle could be a single integral construction with multiple sections, e.g., two sections, sections 103 and 113 as shown, or each section could be a separate construction, e.g., separate paddle elements 103 and 113. Each integrated circuit element 102 is then covered with a blob of gel 109, such as Hipec-9224 from Dow Corning, such as to cover the integrated circuit element. For multiple integrated circuit elements, two or more elements may be covered by a single gel blob if desired. The gel-covered assembly is then placed into a cavity 106 of a plastic-molding tool. Alternatively, the gel is applied after the paddle(s) have been placed in the plastic molding tool.

One or more retractable pins 101 extend from the plastic-molding tool (only one pin is shown, however, FIG. 4 illustrates a specific example with two pins). Each pin is preferably arranged and designed to touch the surface of one gel blob 109, although multiple pins may contact a single gel blob. Preferably, each pin 101 is an integral part of the molding tool, e.g., extending from an inner surface of a portion of the tool, although a separate pin may be used. In one embodiment, each pin 101 is retractable and is arranged to be long enough to make contact with the gel blob when the pin is extended, and to retract into the bulk of the mold tool when retracted. A plastic encapsulant is then injected (hot and under pressure) via an injection hole 107 in the tool in the conventional manner and fills the cavity 106. Each moveable pin 101 is withdrawn sufficiently to clear the cavity and the molded device is ejected from the tool cavity and is ready for test. In one embodiment, each pin is removed by removing or separating the molding tool portion including the pin. The resulting finished packaged device includes a small hole or passageway through the plastic encapsulant that permits the gel 109 covering the integrated circuit element 102 to be exposed to the atmosphere surrounding the package. For a pressure sensitive element the pressure is transferred to the pressure sensitive integrated circuit due to the flexibility of the gel. For radiation sensitive and transmitting elements, the gel is preferably removed (e.g., mechanically, dissolved or washed away, or sucked out). The open passageway defines an aperture in the plastic after molding which allows for the passage of radiation to and from the radiation element.

In one embodiment of the invention as shown in FIG. 1, one or more additional integrated circuits e.g., circuit elements 104 and 114, are mounted in the same package, which in combination with the pressure sensitive integrated circuit 102 form a pressure sensing assembly that is more suitable for particular applications. The additional integrated circuits may include, for example, signal processing circuitry, power generation circuitry, power supply circuitry, and signal transmission and reception circuitry.

In one embodiment of the invention, additional integrated circuits, e.g., circuitry 114 and 104, are arranged and configured to extract energy from an externally applied radio frequency (RF) field, supply operating power at suitable voltages to each of the integrated circuits in the package, transmit information relating to the pressure sensed by the pressure sensitive integrated circuit 102 such that the encapsulated assembly requires external connections only to a suitable interface, such as an antenna. Such an assembly is ideally suited for such applications as in tire pressure monitoring systems, wherein the assembly is mounted within a tire or the valve of a tire such that the pressure within the tire is sensed and transmitted to the vehicle for use in, for example, an on-board electronic control module to warn the driver of tire pressure loss.

In one embodiment of the invention as shown in FIG. 2, the integrated circuit element 102 is mounted on a separated section 113 of the die paddle. The dimensions of the separated section 113 are arranged relative to the dimensions of the integrated circuit element 102 and the surface tension of the gel 109 so that the gel blob covers the whole section of the die paddle 113 and such that the outer gel blob surface stays clear of the die edges. This ensures that there is no opportunity for the plastic encapsulant to touch the integrated circuit element 102 and induce errors, e.g., errors due to stress.

In a further embodiment as illustrated in FIG. 3a, bond wires 118 between the integrated circuit element 102 and the interface circuit, e.g., circuitry 114, are arranged to rise from the surface of the integrated circuit element 102 until they are clear of the gel blob 109. This ensures that the gel has no tendency to creep along the wire and contaminate the surface of the interface circuit. In an alternative embodiment as shown in FIG. 3b (gel 109 not shown), the bond wires 118 are given a more complex variation in height profile such that creep is halted by a section of rising bond wire at some point along its length. In yet another alternative embodiment, the section of paddle 113 carrying the integrated circuit element is lowered relative to the remainder of the die paddle 103 such that the bond wires naturally rise from the integrated circuit 102 towards the interface circuit, e.g., circuit 114 of FIG. 1.

In one embodiment, as shown in FIG. 4, transmitting and receiving elements 201 of an Infra Red (IR) or visible light sensing system are mounted onto a single, or separate, substrate or lead frame ready to be encapsulated into a single package. An IR or light transmitting element $202_1$, mounted on paddle 213, is covered with a first covering of flexible gel coat $209_1$ and an IR or light sensitive element $202_2$ of the sensor is covered with a separate second flexible gel coat $209_2$. Alternatively, both elements 202 may be covered with a single gel blob 209. The assembly is inserted into a molding tool cavity 206. One or more retractable pins are incorporated into the molding tool and in the normal position are in contact with the gel. As shown, retractable pin $201_1$ is in contact with element $202_2$ and retractable pin $201_2$ is in contact with element $202_2$. A molding compound is injected into the cavity via injection hole 207 so as to encapsulate the device and gel coat. Each pin is extracted and the device ejected from the moulding cavity. In one embodiment, the exposed gel is removed from the device so that the IR or optical transmitting and sensing elements are exposed via the spaces defined by the retractable pins. The shape of the pins defines the shape of the cavities and thereby defines the field of view of the transmitting and receiving elements. The pins proximal the sensing and transmission elements are preferably configured and arranged so that the resulting passageways/apertures align the elements with an intended target. The sensor operates by detecting with the light sensitive element $202_2$ IR or optical radiation transmitted by the transmitting element $202_1$ and reflected back from a target. The minimum range to the target is generally defined by the profile of the space defined by the pins. The target can be seen through an intermediate IR or optically transmitting medium. For example, the sensor can "see" into a suitable container to detect the level of fluid or powder or to detect the movement of a rotor or piston. In one embodiment, the IR or optical device is protected from the elements by a suitable IR or visible light transparent window mounted on the outside of the molded package or by embodying the assembly into the housing of a completed sensor. Such a window advantageously prevents the ingress of moisture, dust, etc.

The holes/passageways in the plastic can be partly or wholly refilled with a suitable IR or optically transmitting gel or plastic. The meniscus formed at the top surface of such a gel forms a simple lens which at short range can increase the effectiveness of the sensor by partly focussing the IR or optical radiation onto the sensitive areas when the target is at the desired range. It should be appreciated that an optically transmitting gel or plastic may be used as a gel blob prior to encapsulation. It should also be appreciated that different gels may be used to cover different elements, both before and after the molding has been injected.

It should be appreciated that the invention is a modification to conventional and well understood semiconductor molding techniques and as such problems such as those of the molding compound adhering to the retractable pins and precluding its withdrawal are already addressed and solved by using similar techniques as are used to stop the plastic adhering to the mold tool itself. Thermal expansion mismatch between the silicon (or other typical die materials), the metal and the plastic are again already solved within the semiconductor industry. Thermal expansion mismatch between the gel and the other materials are not a problem since the gel is by its nature flexible. The gel will typically expand with the temperature increase resulting from the molding process and then contract as the temperature falls. The gel typically has a much higher, e.g., on the order of approximately eight to ten times higher, temperature coefficient of expansion than the mold compound. Upon cooling after the molding process, the gel typically shrinks so as to leave a gap between the gel and the mold compound that helps reduce or remove mechanical stress on the pressure sensitive integrated circuit that might otherwise reduce the accuracy of the measurements.

In a further embodiment, each pin is arranged as a fixed part of the mold tool and the mold tool separation process is arranged such that the direction of separation extracts the pin from the molded assembly without damage to the pin or the assembly.

In a further embodiment of the invention, one or more pins, e.g., pin 101, include a hollow tube. During the over molding process there may be a tendency in some mold tool designs for the mold compound to move the top of the flexible gel blob such that it is no longer in contact with the pin. To overcome this the pin is replaced by a tube. During the molding process a small amount of suction, e.g., using a vacuum pump, is applied to the external end of the tube such as to hold the gel to the end of the tube and prevent the tube and the gel from becoming separated.

It should be appreciated that the chemical and physical properties of the gel are important for the intended application. For example, the moisture resisting properties and the chemical resistance of the selected gel protect the integrated circuit from the environment. The mechanical properties, particularly the compressibility of the gel, will affect the time lag in transferring the external pressure to a pressure sensitive integrated circuit. Such a time lag may be desired, since it can be arranged such that impulsive pressures are damped by a combination of the dimensions of the hole and the viscosity of the gel. The damping of the gel may also act as a low pass filter and assist any interface or processing circuitry in extracting, e.g., the actual mean tire pressure from the noisy signal generated as the tire moves over the road surface. In certain applications, a more suitable flexible compound or even a flexible adhesive compound may replace the gel. Such choices will depend on the physical and chemical attributes of the local environment in which the device is to operate.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An encapsulated integrated sensor device, formed by:
providing an integrated circuit, the integrated circuit including a sensing element;
applying a quantity of gel to the integrated circuit such as to cover at least the sensing element, thereby forming a gel-covered assembly;
inserting the gel-covered assembly into a cavity of a molding tool;
attaching a retractable pin to the gel-covered assembly;
introducing a plastic mold compound into the cavity so as to encapsulate the gel-covered assembly and at least a portion of the retractable pin; and
removing the retractable pin from the gel such as to leave a passageway in the plastic mold compound encapsulating the gel-covered assembly, thereby exposing the gel to an atmosphere through the passageway.

2. The device of claim 1, wherein the sensing element includes one of a pressure sensing element and a radiation sensing element.

3. An encapsulated integrated sensor device, formed by:
providing an integrated circuit, the integrated circuit including a radiation sensing element and a radiation transmission element;
applying a gel to the integrated circuit such as to cover at least the radiation sensing element and the radiation transmission element, thereby forming a gel-covered assembly;
inserting the gel-covered assembly into a cavity of a molding tool;
attaching at least two retractable pins to the gel-covered assembly, a first pin contacting the gel at a location proximal the radiation sensing element and a second pin contacting the gel at a location proximal the radiation transmission element;
introducing a plastic mold compound into the cavity so as to encapsulate the gel-covered assembly and at least a portion of each pin; and
removing the first and second pins from the gel such as to leave passageways in the plastic mold encapsulating the gel-covered assembly, thereby exposing the gel to an atmosphere through the passageways.

4. The device of claim 3, wherein a shape of the first pin is configured so as to correspond with a shape of the radiation sensing element and wherein a shape of the second pin is configured so as to correspond to a shape of the radiation transmission element.

5. The device of claim 3, wherein the orientation of the first pin is arranged such that a first passageway in the plastic mold encapsulating the gel-covered assembly aligns the radiation sensing element with an intended target, and wherein the orientation of the second pin is arranged such that a second passageway in the plastic mold encapsulating the gel-covered assembly aligns the radiation transmission element with the intended target.

6. The device of claim 3, wherein the first and second pins are each oriented such that first and second passageways in the plastic mold encapsulating the gel-covered assembly (package) align the radiation sensing element and radiation transmission element, respectively, with an intended target position external to the package.

7. The device of claim 1, wherein a shape of the retractable pin is configured to correspond with a shape of the sensing element.

8. The device of claim 1, wherein the pin is oriented such that the passageway in the plastic mold compound aligns the sensing element with an intended target position external to the plastic mold compound.

9. The device of claim 1, further formed by filling the passageway with an optically transparent gel.

10. The device of claim 1, further formed by mounting an optically transparent window so as to seal the passageway.

* * * * *